United States Patent
Kudoh et al.

(10) Patent No.: US 7,286,074 B2
(45) Date of Patent: Oct. 23, 2007

(54) SEMICONDUCTOR INTEGRATED CIRCUIT FOR COMMUNICATION INCLUDING ANALOG-TO-DIGITAL CONVERSION CIRCUIT

(75) Inventors: Junya Kudoh, Takasaki (JP); Kouichi Yahagi, Takasaki (JP); Tatsuji Matsuura, Tokyo (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 11/189,701

(22) Filed: Jul. 27, 2005

(65) Prior Publication Data

US 2006/0022861 A1    Feb. 2, 2006

(30) Foreign Application Priority Data

Jul. 28, 2004  (JP)  .............................. 2004-219830

(51) Int. Cl.
*H03M 1/34* (2006.01)
(52) U.S. Cl. ........................................ 341/162; 341/155
(58) Field of Classification Search ................ 341/162, 341/161, 155
See application file for complete search history.

(56) References Cited

U.S. PATENT DOCUMENTS 5,140,325 A *   8/1992  Yu et al. ...................... 341/143
6,683,554 B2 *  1/2004  Nikai et al. .................. 341/161
6,822,598 B2 * 11/2004  Kobayashi ................... 341/155
6,868,263 B2 *  3/2005  Filipovic ................... 455/245.1

FOREIGN PATENT DOCUMENTS

JP   2000-201054   7/2000
JP   2002-368621  12/2002

* cited by examiner

*Primary Examiner*—Rexford Barnie
*Assistant Examiner*—Joseph Lauture
(74) *Attorney, Agent, or Firm*—Mattingly, Stanger, Malur & Brundidge, P.C.

(57) ABSTRACT

A semiconductor integrated circuit having a built-in A/D conversion circuit which enables, where the A/D conversion circuit is to be built into a semiconductor chip, the required capacitance of the stabilization capacitor to be connected to the output terminals of reference voltage generators for generating reference voltages to be reduced is to be provided to contribute to preventing the number of external terminals and the chip size from increasing. A semiconductor integrated circuit having a built-in differential type A/D conversion circuit comprising a differential amplifier, a local A/D converter and local D/A converters, further provided with a first reference voltage generator for generating a first reference voltage and a second reference voltage generator for generating a second reference voltage both for use by the local A/D converter, wherein the first reference voltage generator and the second reference voltage generator are provided as common reference voltage generators with a reference voltage generator for generating a first reference voltage and a second reference voltage both for use by the local D/A converters, and a capacitance element for stabilizing the generated reference voltages is connected between the output terminal of the first reference voltage generator and that of the second reference voltage generator.

8 Claims, 7 Drawing Sheets

SEMICONDUCTOR INTEGRATED CIRCUIT FOR COMMUNICATION INCLUDING ANALOG-TO-DIGITAL CONVERSION CIRCUIT

The present application claims priority from Japanese patent application No. 2004-219830 filed on Jul. 28, 2004, the content of which is hereby incorporated by reference into this application.

BACKGROUND OF THE INVENTION

The present invention relates to a technique of stabilizing reference voltages for use in analog-to-digital (A/D) conversion in A/D converters for converting analog signals into digital signals and in on-chip A/D converters equipped with local A/D converters and local D/A converters, and more particularly to a technique that can be effectively used in, for instance, $\Sigma\Delta$ (sigma delta) type A/D converters and semiconductor integrated circuits with such converters built into them.

A wireless communication system, such as a cellular phone, usually comprises a semiconductor integrated circuit (RF-IC) having functions to modulate transmit signals and to demodulate receive signals, another semiconductor integrated circuit, such as a baseband circuit for converting transmit data into I signals in the same phase as the fundamental wave and Q signals orthogonal to the same and restoring data by processing the I and Q signals resulting from the demodulation of receive signals, and a power module, including a power amplifier, for power-amplifying transmit signals and outputting them from an antenna. In many past cases, the I and Q signals conveyed between the RF-IC and the baseband LSI were analog signals.

On the other hand, the baseband LSI, wherein most internal processing is digitally accomplished, is usually provided on its part with an A/D converter for converting receive analog I and Q signals which have been inputted into digital signals and a D/A converter for converting transmit digital I and Q signals into analog signals. In this case, since the baseband LSI, in spite of being mostly a digital circuit, has the A/D converter and the D/A converter, which are analog circuits, built into it, the LSI manufacturing process involves steps of forming elements to constitute the analog circuits, inviting a disadvantage that the chip cost correspondingly rises.

In view of this problem, the present inventors studied the possibility of equipping the RF-IC side with an A/D converter and a D/A converter, and conveying I and Q signals in a digital form between the RF-IC and the baseband LSI. The presence of the A/D converter and the D/A converter on the RF-IC side eliminates the need for an A/D converter and a D/A converter on the baseband LSI side and the need for a step of fabricating analog circuit elements in the manufacturing process, both contributing to reducing the chip cost. At the same time, the high-gain amplifier circuit and the filter which would otherwise be required downstream from the demodulator in the reception-related circuits of the RF-IC can be dispensed with, making it possible to reduce the chip size.

By digitizing the I signals and the Q signals, the signal-to-noise (SN) ratio can be improved. The addition of an A/D converter and a D/A converter to the RF-IC side does not entail so great an extra cost as the arrangement of an A/D converter and a D/A converter on the baseband LSI side, because the RF-IC essentially has analog circuits and the additional analog circuit does not complicate the process though it involves an increase in chip size.

Already, various types of A/D conversion circuits have been developed, including the sequential comparison type and the over-sampling type. Generally speaking, where analog input signals are to be converted into digital signals with an A/D conversion circuit, the S/N characteristics in the vicinities of the signal frequency can be enhanced by setting the sampling frequency high. The over-sampling type A/D conversion circuit improves the S/N characteristics by setting a high ratio of the over-sampling ratio (the ratio of the Nyquist rate (1/2 of the sampling frequency) to the frequency of the signal band).

Over-sampling type A/D conversion circuits can be broadly classified into the $\Delta$ (delta) modulation type, the $\Sigma\Delta$ modulation type and their combination. Of these types, the $\Sigma\Delta$ modulation system integrates the difference between the output signal and the input signal with an integrator, and performs feedback control to minimize the output of this integrator. In this $\Sigma\Delta$ modulation system, the S/N characteristics can be further improved by increasing the order of analog integration, i.e. the number of integrators. Thus, every time the order of analog integration is increased by one, noise shaping performance substantially in inverse proportion to the square of the over-sampling ratio can be expected.

The present inventors considered an over-sampling type A/D conversion circuit, especially an A/D conversion circuit of the $\Sigma\Delta$ modulation system (hereinafter referred to as $\Sigma\Delta$ A/D conversion circuit), to be most suitable, in respect of the accuracy and speed of modulation, as the A/D conversion circuit to be built into the RF-IC for converting I and Q signals demodulated by the demodulator into digital signals. Inventions relating to conversion of I and Q signals demodulated by a demodulator into digital signals with a $\Sigma\Delta$ A/D conversion circuit provided on the RF-IC and their communication to a baseband circuit include one described in Patent Reference 1 for instance.

Another invention under a prior application related to the present invention is disclosed in Patent Reference 2. The publication of this earlier invention discloses a configuration in which a capacitance element is connected between the output terminals of reference voltage generators for generating differential reference voltages in a switched capacitor type A/D conversion circuit, but according to this prior invention capacitance elements are also connected between an inverted output terminal and a grounding point and a non-inverted output terminal and a grounding point. However, the publication makes no mention of reducing the number of stabilization capacitances or their capacitances or keeping constant the difference between the two reference voltages. Therefore, this earlier invention entirely differs in underlying idea from the invention under the present application.

Patent Reference 1: Japanese Patent Application Laid-Open No. 2002-368621

Patent Reference 2: Japanese Patent Application Laid-Open No. 2000-201054

SUMMARY OF THE INVENTION

Generally speaking, any A/D converter or D/A converter requires a reference voltage, which should be very accurate in order to achieve highly accurate A/D conversion or D/A conversion. However, a D/A converter is provided with a switching element for switching over the reference voltage. Also, a switched capacitor type A/D converter is equipped with a switching element for transferring electric charges and a capacitance element. Turning on or off this switching element may invite a variation of the reference voltage. A conventional practice to restrain variations of this reference voltage, is to lower the impedance by connecting a stabilization capacitor (bypass capacitor) to the output terminal for the reference voltage generator which generates the reference voltage.

An A/D conversion circuit, if desired to achieve an A/D conversion accuracy of 10 bits or more, will require a large capacity of around a few µF, which is too large to be easily built into a semiconductor chip. It was further found out that a ΣΔ A/D conversion circuit would need at least two, or a switched capacitor type would need three, reference voltages, which means the need for three stabilization capacitors correspondingly. The number of external terminals to which the stabilization capacitors are to be connected should also be greater, inviting an increase in the number of component items required.

An object of the present invention is to provide a semiconductor integrated circuit reduced in the required number of stabilization capacitors to be connected to the output terminals of a reference voltage generator for generating a reference voltage when an A/D conversion circuit equipped with a local A/D converter and a local D/A converter is to be built into the semiconductor chip and having a built-in A/D conversion circuit capable of avoiding increases in chip size and in the number of external terminals.

Another object of the invention is to provide a semiconductor integrated circuit with a built-in A/D conversion circuit capable of highly accurate A/D conversion while restraining the increase of chip size.

Still another object of the invention is to help reduce the size of systems using semiconductor integrated circuits with built-in A/D conversion circuits.

These and other objects and novel features of the invention will become more apparent from the description in this specification when taken in conjunction with the accompanying drawings.

Some of the typical aspects of the invention disclosed in this application will be briefly summarized below.

Thus, a semiconductor integrated circuit having a built-in A/D conversion circuit comprising a differential amplifier, a local A/D converter and a local D/A converter is provided with a common first reference voltage generator for generating a first reference voltage for use by the local A/D converter and the local D/A converter and a common second reference voltage generator for generating a second reference voltage for use by the local A/D converter and the local D/A converter, wherein a capacitance element for stabilizing the generated reference voltages is connected between the output terminal of the first reference voltage generator and that of the second reference voltage generator.

The means described above, since it does not require the connection of a stabilization capacitor to each output terminal of the first reference voltage generator and the second reference voltage generator, the number of stabilization capacitors can be reduced, and the total capacitance of the capacitors can be sufficiently reduced to form them on the semiconductor chip. As an A/D conversion circuit having a differential amplifier can achieve accurate A/D conversion if the difference in reference voltage is accurate enough even if there is a deviation in absolute value, there will be no problem arising from the connection of a stabilization capacitor between the output terminals of the first reference voltage generator and the second reference voltage generator as described above, resulting in the advantage of reducing the number of required stabilization capacitors as stated above.

The configuration of a semiconductor integrated circuit provided with a built-in second-order ΣΔ A/D conversion circuit comprising two integrators each having a differential amplifier, a local A/D converter and two local D/A converters may be such that it is further provided with a common first reference voltage generator for generating a first reference voltage and a common second reference voltage generator for generating a second reference voltage for use by the two local D/A converters, wherein a capacitance element for stabilizing the generated reference voltages is connected between the output terminal of the first reference voltage generator and that of the second reference voltage generator, and a reference voltage generator for generating a first reference voltage and another reference voltage generator for generating a second reference voltage for use by the local A/D converter are provided as separate circuits from the first and second reference voltage generators.

The means described above, since it does not require the connection of a stabilization capacitor to each output terminal of the first reference voltage generator and the second reference voltage generator for the local D/A converters, the number of stabilization capacitors can be reduced; at the same time a stabilization capacitor of a large capacitance can be connected to the reference voltage generator for one of the local D/A converters which requires generation of a highly accurate reference voltage while a stabilization capacitor of a small capacitance can be connected, or the connection of a stabilization capacitor can be entirely dispensed with, to the reference voltage generator for the other local D/A converter which does not require a highly accurate reference voltage. The required capacitance of the capacitors can be thereby made smaller than where the reference voltages for the local A/D converter and those for the local D/A converters are generated by a common reference voltage generator, with the result that the total capacitance of the capacitors can be reduced even if stabilization capacitors are separately connected.

Here, the A/D conversion circuit having the local A/D converter and the local D/A converters will be particularly effective if it is a ΣΔ A/D conversion circuit provided with an integrator for integrating the differences between inputs and outputs, a local A/D converter for quantizing the outputs of the integrator, and local D/A converters for subjecting the output of the local A/D converter to D/A conversion and feeding back the converted output to the input of the integrator.

In the ΣΔ A/D conversion circuit, if the output requires an accuracy of 14 bits, while the local D/A converters will also require an accuracy of 14 bits, the local A/D converter, if its output is 3 bits, will require an accuracy of no more than 3 bits. Thus the reference voltage to be used by the local A/D converter can be far lower in accuracy than the reference voltage for the local D/A converters. For this reason, the capacitance of the stabilization capacitor to be connected to the reference voltage generator for generating the reference voltage for use by the local A/D converter may be considerably small, or this stabilization capacitor can be entirely dispensed with in some cases.

Further, the invention can be effectively applied to a ΣΔ A/D conversion circuit consisting of a switched capacitor circuit. Although a switched capacitor circuit involves switching, accordingly the reference voltage is apt to vary at the time of switching, and therefore it is preferable for the capacitance of its stabilization capacitor to be as large as practicable, installation of a separate reference voltage generator for generating the reference voltage required by the local A/D converter from the reference voltage generator for generating the reference voltage required by local D/A converters enables the required capacitance of the stabilization capacitors to be reduced as compared with the configuration in which the reference voltage for the local A/D converter and that for the local D/A converters are generated by a common reference voltage generator.

Thus, if a common reference voltage generator is used, a considerably large stabilization capacitance will be needed in order to sufficiently restrain the variation of the reference voltage due to the switching of the local A/D converter and that of the reference voltage due to the switching of the local D/A converters to a level where the desired accuracy of conversion can be achieved. However, where a separate reference voltage generator is provided, the stabilization capacitor of the reference voltage generator for the local D/A converters has only to suppress the reference voltage variation due to the switching of the local D/A converters, its capacitance can be much reduced.

At the same time in the $\Sigma\Delta$ A/D conversion circuit, since the reference voltage used by the local A/D converter need not be so accurate as the reference voltage used by the local D/A converters, the stabilization capacitance of the reference voltage generator for the local D/A converters can be reduced, making it possible to make the total capacitance considerably small even if separate stabilization capacitors are to be connected. By reducing the capacitance of the stabilization capacitors, it is made possible to build them into the semiconductor chip and to dispense with external terminals for connecting the stabilization capacitors, thereby contributing to restraining the increase in chip size. Furthermore, even if the capacitance of the stabilization capacitors of the reference voltage generator, highly accurate A/D conversion can be achieved and, as no external capacitance element is needed, the size of the semiconductor integrated circuit with a built-in A/D conversion circuit can be reduced.

Preferably, the stabilization capacitance element connected between the first reference voltage generator and that of the second reference voltage should be arranged in a position close to the area in which the first-stage local D/A converter out of the two local D/A converters is formed. This enables the reference voltage to be supplied to the first-stage local D/A converter, which requires higher accuracy, to be stabilized, making it possible to achieve more accurate A/D conversion.

Advantages provided by some of the typical aspects of the invention disclosed in the present application will be briefly described below.

Thus, the invention enables the required number of stabilization capacitors connected to the output terminals of reference voltage generators for generating reference voltages to be reduced and the A/D conversion circuit to be built into a semiconductor chip, thereby making it possible to realize a semiconductor integrated circuit which facilitates avoiding increases in the number of external terminals and the chip size.

The invention further makes it possible to obtain a semiconductor integrated circuit with a built-in A/D conversion circuit capable of highly accurate A/D conversion while restraining the increase in the chip size, and at the same time to achieve a reduction in the size of the system using a semiconductor integrated circuit with a built-in A/D conversion circuit.

DESCRIPTION OF THE PREFERRED EMBODIMENTS

Preferred embodiments of the present invention will be described in detail with reference to the accompanying drawings.

Figure 1:
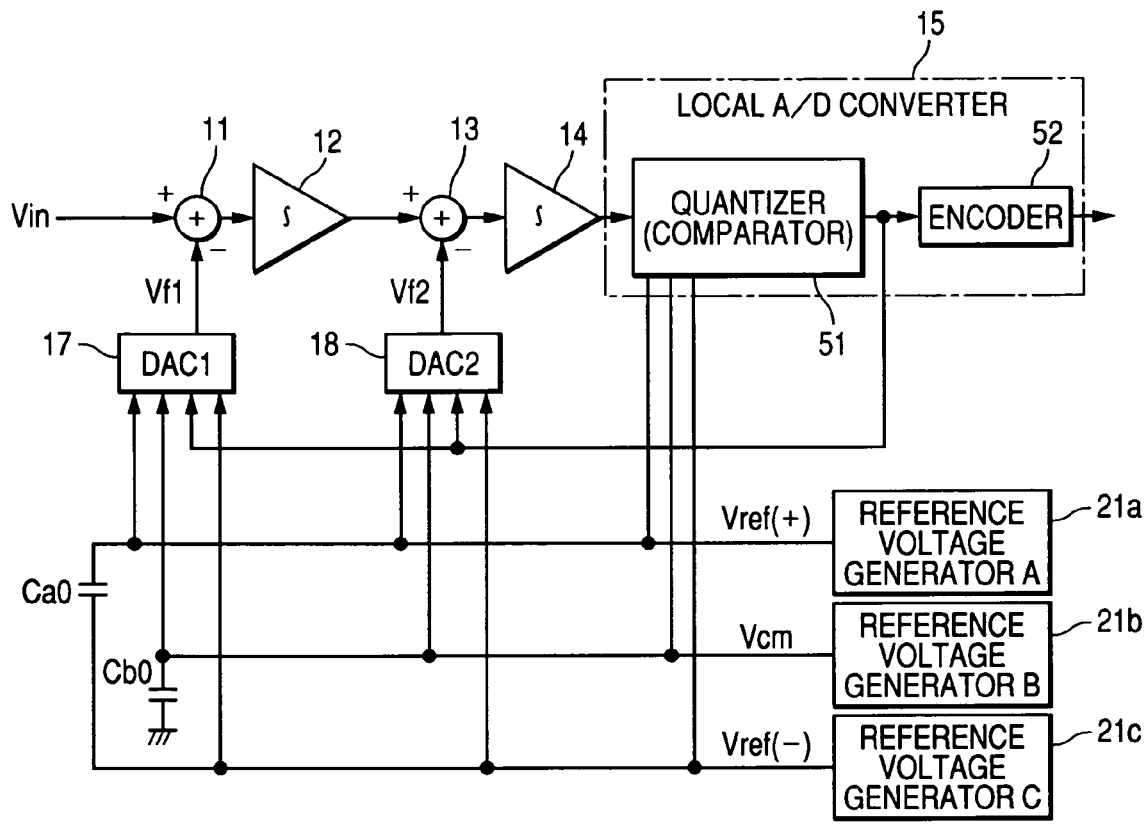
FIG. 1 is a block diagram of an A/D conversion circuit of a $\Sigma\Delta$ modulation system, which is a first preferred embodiment of the present invention.

FIG. 1 is a block diagram of an A/D conversion circuit of a $\Sigma\Delta$ modulation system, which is a first preferred embodiment of the present invention.

The A/D conversion circuit shown in FIG. 1 is supposed to be a second-order $\Sigma\Delta$ modulation system, which is formed into a single semiconductor substrate, such as a monocrystalline silicon chip, by a known semiconductor integrated circuit fabrication technique.

The $\Sigma\Delta$ A/D conversion circuit shown in FIG. 1 comprises a first adder 11 for calculating the difference between an analog input signal Vin and a feedback signal Vf1, a first integrator 12 for integrating the outputs of the first adder 11, a second adder 13 for calculating the difference between the output of the first integrator 12 and a feedback signal Vf2, a second integrator 14 for integrating the outputs of the second adder 13, a local A/D converter 15 for converting the outputs of the second integrator 14 into N-bit digital signals and outputting them, and a first local D/A converter (DAC1) 17 and a second local D/A converter (DAC2) 18 for subjecting the outputs of the A/D converter 15 to D/A conversion and supplying the converted signals to the first adder 11 and the second adder 13.

The local A/D converter 15 can be composed of a quantizer 51 for comparing the outputs of the second integrator 14 with reference voltages and quantizing them and an encoder 52 for encoding the outputs of the quantizer 51. When the output of the encoder 52 consists of N bits (N is 2 or a larger integer), the output signal of the quantizer 51 is the N-th power of 2. The quantizer 51 is composed of a voltage comparator for comparing the output voltages of the second integrator 14 with reference voltages as many as the N-th power of 2. The output signals of the voltage comparator are encoded by the encoder 52 into N-bit signals, which are conveyed to downstream circuits as the output signals of the ΣΔ A/D conversion circuit.

At the same time, the output signals of the quantizer 51 are also conveyed to the local D/A converters 17 and 18, which consist of voltage comparators, and the analog signals resulting from conversion by the local D/A converters 17 and 18 are supplied to the first adder 11 and the second adder 13 as feedback signals Vf1 and Vf2. Incidentally, a subtractor which subtracts a value b from another value a can be regarded as an adder which adds −b to a, subtractors are deemed to be adders in this specification.

In this embodiment, a reference voltage generator for generating reference voltages Vref(+), Vcm and Vref(−) required by the local A/D converter 15 and another reference voltage generator for generating reference voltages Vref(+), Vcm and Vref(−) required by the local D/A converter 17 are provided as common reference voltage generators 21a, 21b and 21c.

Along with that, a stabilization capacitor Ca0 of a relatively large capacitance is connected between the output terminals of the reference voltage generators 21a and 21c for generating the reference voltages Vref(+) and Vref(−), and a stabilization capacitor Cb0, whose capacitance is smaller than that of the stabilization capacitor Ca0, is connected to the reference voltage generator 21b for generating the reference voltage Vcm. Incidentally, Vcm is an intermediate potential between Vref(+) and Vref(−); where Vref(+) is 1.9 V and Vref(−) is 0.9 V for instance, Vcm is 1.4 V.

It is also conceivable to connect a stabilization capacitor to each reference voltage generator in the ΣΔ A/D conversion circuit shown in FIG. 1, but in the configuration in which the stabilization capacitor Ca0 is connected between the output terminals of the reference voltage generators 21a and 21c for generating the reference voltages Vref(+) and Vref(−) as in this embodiment, the number of capacitance elements can be smaller than in an arrangement in which stabilization capacitors are connected separately, and accordingly it is easier to configure them for mounting on a chip.

In this embodiment, each of the first integrator 12 and the second integrator 14 is supposed to be a circuit having a differential type amplifier as will be described afterwards (with reference to FIG. 5). As such a circuit having a differential amplifier will give an accurate A/D conversion result if the reference voltage difference is accurate even if there is a deviation in absolute value, the connection of the stabilization capacitor Ca0 between the output terminals of the reference voltage generator 21a for generating the reference voltage Vref(+) and of the reference voltage generator 21c for generating the reference voltage Vref(−) can provide the benefit of reducing the number of stabilization capacitors without posing any problem.

Figure 2:
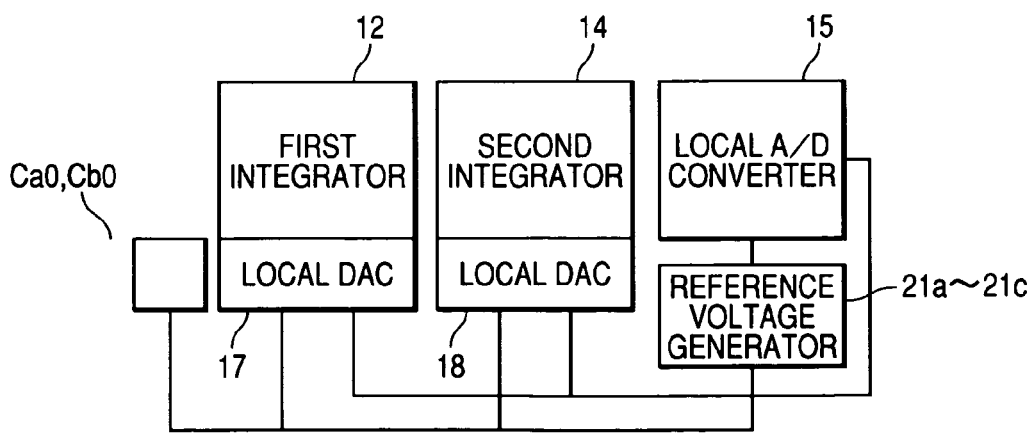
FIG. 2 is a layout diagram of an example of arrangement of a reference voltage generators and stabilization capacitors in the $\Sigma\Delta$ A/D conversion circuit embodying the invention.

Furthermore in this embodiment, the stabilization capacitors Ca0 and Cb0 connected between the output terminals of the reference voltage generators 21a through 21c are arranged in a position close to the area in which the first-stage local D/A converter 17 out of the two local D/A converters 17 and 18 is formed as shown in FIG. 2. Where the reference voltage generators 21a through 21c are distant from the local D/A converter 17 as shown in FIG. 2, when the local D/A converters 17 and 18 operate, the reference voltages may be varied by the impedance of the wiring for distributing the reference voltages generated by the reference voltage generators 21a through 21c to the local D/A converters 17 and 18.

In the ΣΔ A/D conversion circuit having a plurality of local D/A converters, achieving a high accuracy of the reference voltage of the first-stage local D/A converter is of vital importance to the A/D conversion accuracy of the whole circuit. In this embodiment, as the stabilization capacitors Ca0 and Cb0 are arranged in a position close to the area in which the first-stage local D/A converter 17 is disposed, the variation of the reference voltages by the impedance of wiring is restrained to enable the reference voltages to be stabilized and thereby to achieve highly accurate A/D conversion.

Figure 3:
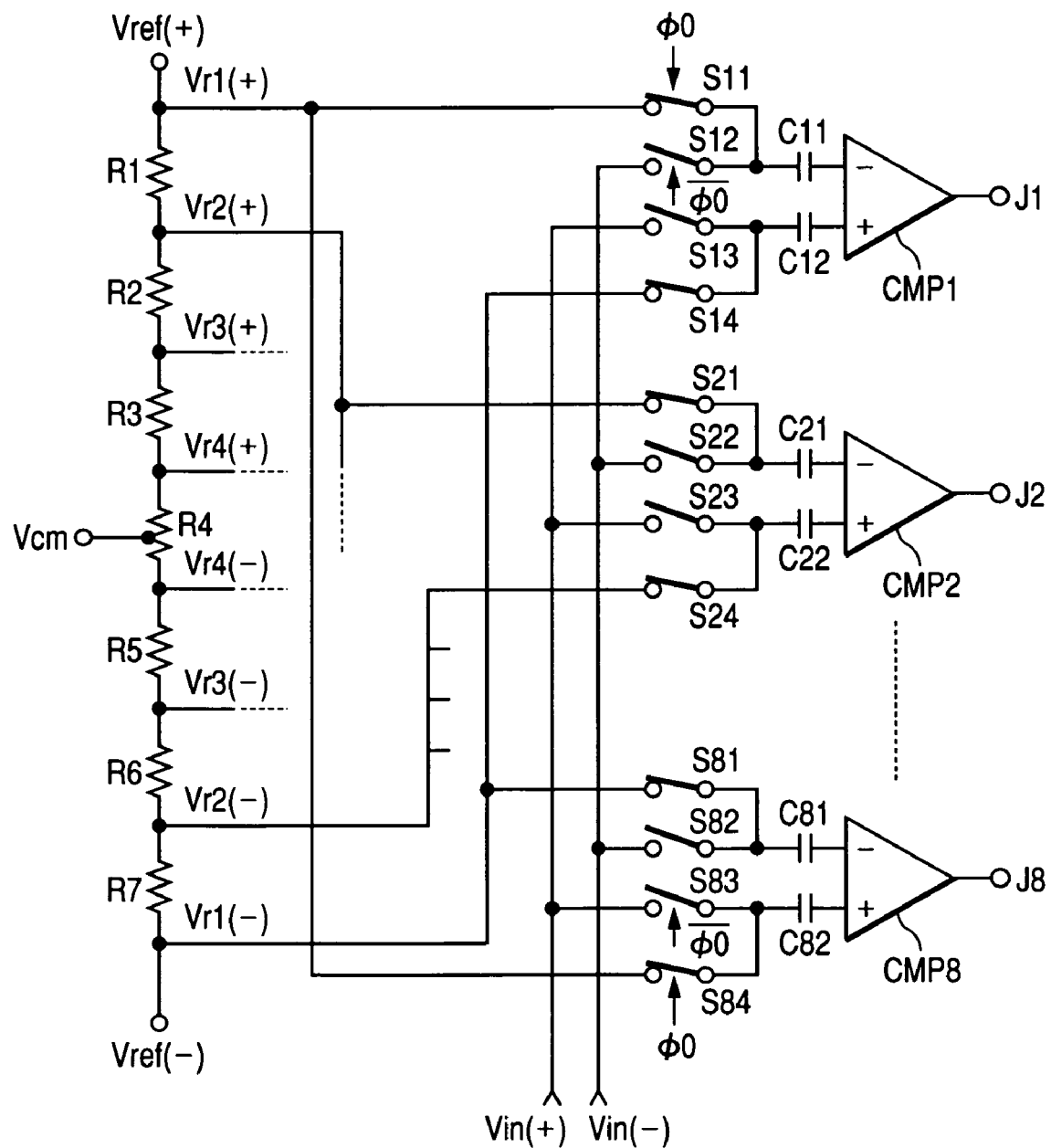
FIG. 3 is a circuit configuration diagram of a specific example of local A/D converter of the $\Sigma\Delta$ A/D conversion circuit embodying the invention.
Figure 4A:
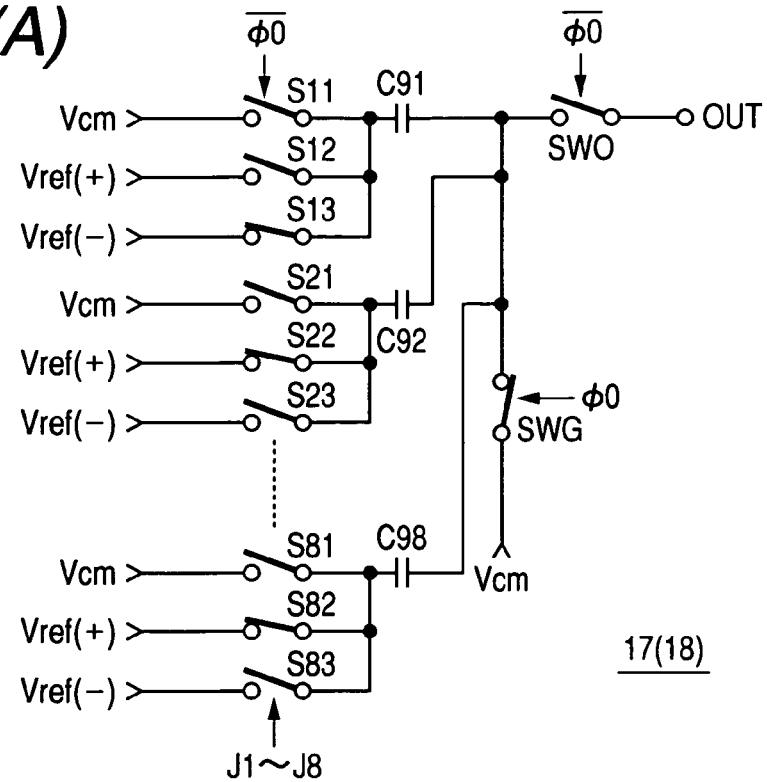
FIG. 4 are circuit configuration diagrams of a specific example of local D/A converter in the $\Sigma\Delta$ A/D conversion circuit embodying the invention.

FIG. 3 shows a circuit configuration diagram of a specific example of the local A/D converter 15; FIG. 4, ones of the local D/A converters 17 and 18, and FIG. 5, one of the integrators 12 and 14. This embodiment uses switched capacitor type circuits, though not limited to this type.

The local A/D converter 15, as shown in FIG. 3, has a multi-bit configuration comprising eight comparators CMP1 through CMP8, eight pairs of input capacitors C11, C12, ... C81 and C82 of the same capacitance, and eight switches SW11 through SW14 ... SW81 through SW84. Reference voltages Vr1(+), Vr1(−) ... Vr4(+) and Vr4(−) generated by dividing the reference voltages Vref(+), Vcm and Vref(−) with a voltage dividing circuit consisting of ladder resistors R1 through R7 can be applied to the comparators CMP1 through CMP8 via the switches SW11, SW14 ... SW81 and SW84. Also, differential outputs from the integrator 14 can be applied as differential inputs Vin(+) and Vin(−) to the input capacitors C11, C12, ... C81 and C82 via the switches SW12, SW13 ... SW82 and SW83.

The local A/D converter 15 shown in FIG. 3 operates in the following sequence: after the switches SW11, SW14 ... SW81 and SW84 are turned on in a first phase (the former half of one cycle of a reference clock φ0) and charges matching the reference voltages Vr1(+), Vr1(−) ... Vr4(+) and Vr4(−) are accumulated in the input capacitors C11, C12, ... C81 and C82; in a second phase (the latter half of one cycle of a reference clock φ0), the switches SW11 through SW14 ... SW81 through SW84 are turned off, and instead the switches SW12, SW13 ... SW82 and SW83 are turned on, inputs Vin and Vin(−) are supplied to the input capacitors C11, C12, ... C81 and C82, and charges matching the differential voltages between Vin and Vin(−) and the reference voltages Vr1(+), Vr1(−) ... Vr4(+) and Vr4(−) remain in C11, C12, ... C81 and C82 with the result that the comparators CMP1 through CMP8, each determining which of the inputs in each pair is higher, so operate as to output eight comparison results J1 through More specifically, when Vin>Vr1(+), J1 through J8 are all "1"; when Vr1(+)>Vin>Vr2(+), J1 through J7="1" and J8="0"; when Vr2(+)>Vin>Vr3(+), J1 through J6="1" and J7, J8="0"; when Vr2(+)>Vin>Vr3(+), J1 through J5="1" and J6 through J8="0"; ... when Vr3(−)>Vin>Vr4(−), J1="1" and J2 through J8="0"; and when Vr4 (−)>Vin, J1 through J8="0".

To add, although the local A/D converter 15 of FIG. 3 does not require the intermediate voltage Vcm for circuit operation, by giving the voltage Vcm to the middle point of the ladder resistors, the divided voltages can be increased in accuracy and stabilized against noise that may come in via coupling capacitors or the like.

The local D/A converters 17 and 18, as shown in FIG. 4, comprise eight capacitors C91 through C98 of the same capacitance, of which one-side terminals are commonly coupled; eight sets of switches S11, S12 and S13 . . . S81, S82 and S83, each set consisting of three switches, connected to the other-side terminals of the capacitors C91 through C98; a switch SW0 connected between the common node of the capacitors C91 through C98 and an output terminal OUT; and a switch SWG connected between the common node of the capacitors C91 through C98 and an analog ground terminal to which the reference voltage Vcm is applied.

Out of the eight switches S11 through S13 . . . S81 through S83, the first switches S11, S21, S31 . . . S81 are intended to convey the intermediate reference voltage Vcm to the capacitors C91 through C98; the next switches S12, S22, S32 . . . S82, the positive reference voltage Vref(+) to capacitors C91 through C98; and the remaining switches S13, S23, S33 . . . S83, the negative reference voltage Vref(−) to the capacitors C91 through C98. Of the switches S12, S22, S32 . . . S82 for conveying the positive reference voltage Vref(+) to the capacitors C91 through C98 and the switches S13, S23, S33 . . . S83 for conveying the negative reference voltage Vref(−) to the capacitors C91 through C98, either one group is turned on and the other off according to the outputs J1 through J8 of the eight comparators CMP1 through CMP8 of the local A/D converter 15.

In the local D/A converters of FIG. 4 in the first phase, as shown in FIG. 4 (A), the switches S11, S21, S31 . . . S81 and the output switch SW0 are turned off, the switch SWG is turned on, the switches S12, S22, S32 . . . S82 and S13, S23 S33 . . . S83 are turned on or off according to the outputs J1 through J8 of the local A/D converter 15, and charges matching the differential potentials between the inputs (Vref (+)or Vref(−)) of the switches which are on and Vcm are accumulated in the capacitors C91, C92 . . . C98.

Figure 4B:
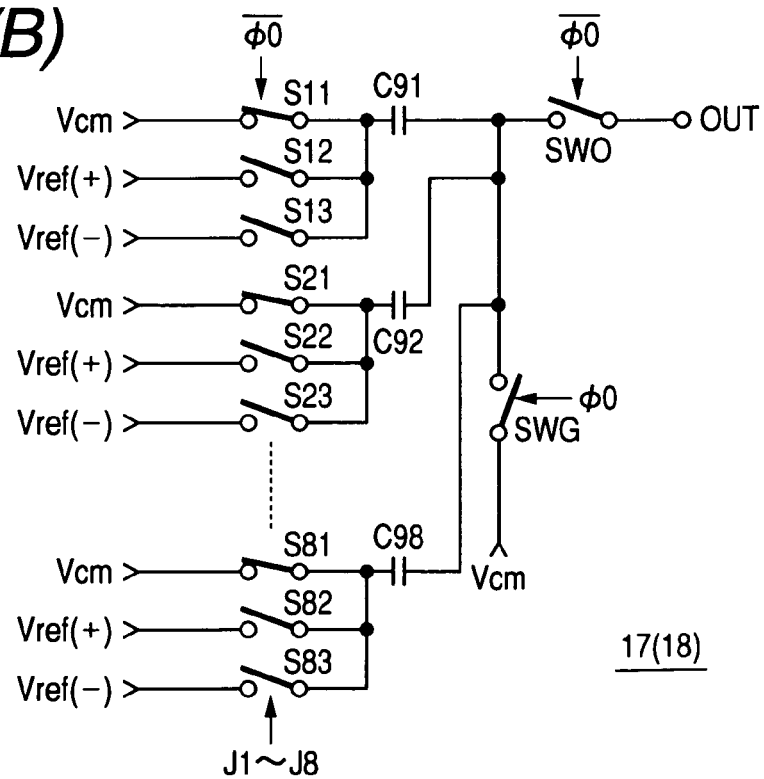

Afterwards in the second phase, as shown in FIG. 4(B), the switches S11, S21, S31 . . . S81 and the output switch SW0 are turned on and the switch SWG and the switches S12, S22, S32 . . . S82 and S13, S23, S33 . . . S83 are turned off to cause a voltage, which is the total of charges accumulated in the capacitors C91, C92 . . . C98, to be conveyed to the output terminal OUT via the switch SW0.

Figure 5:
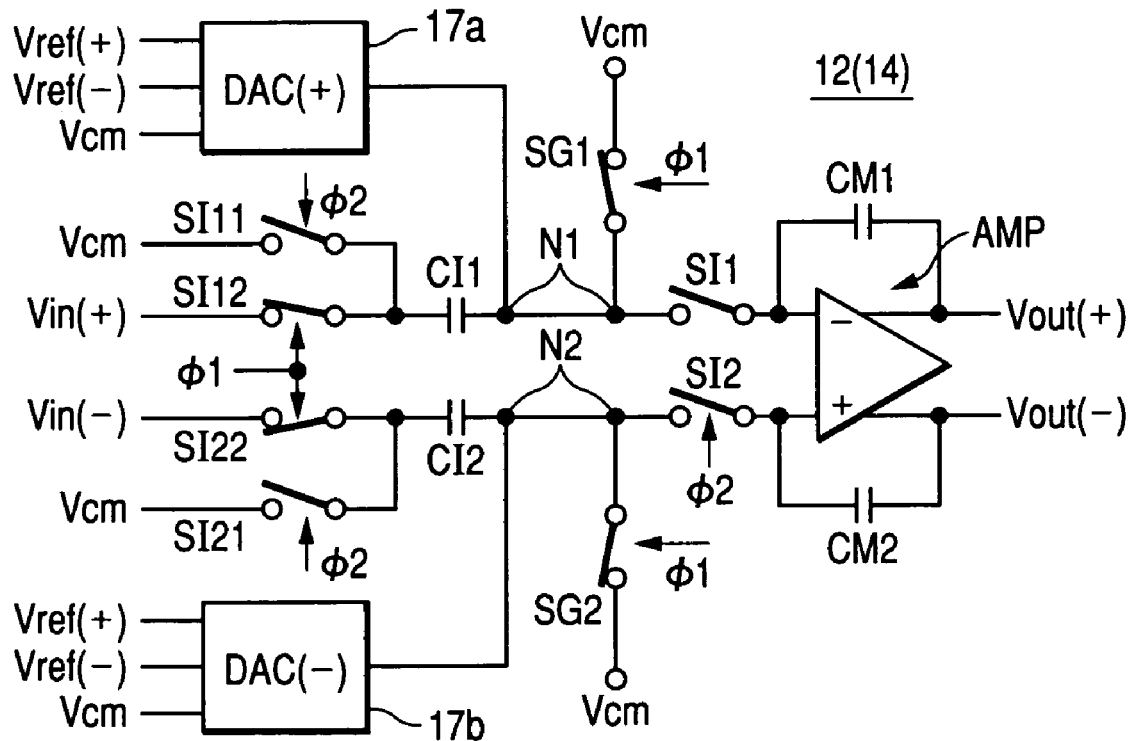
FIG. 5 is a circuit configuration diagram of a specific example of integrator in the $\Sigma\Delta$ A/D conversion circuit embodying the invention.

The integrator 12 or 14, too, comprises a differential amplifier AMP, a pair of integrating capacitors CM1 and CM2 connected between the differential output terminal and the differential input terminal of the differential amplifier AMP, switches SI1 and SI2 connected between the differential input terminal of the differential amplifier AMP and input nodes N1 and N2, a pair of switches SG1 and SG2 connected between the input nodes N1 and N2 and an analog to which the reference voltage Vcm is applied, a pair of input capacitors CI1 and CI2 to which one-side terminals of the input nodes N1 and N2 are coupled, and two sets of switches SI11, SI12 and SI21, SI22 connected to the other-side terminals of these capacitors CI1 and CI2, respectively, as shown in FIG. 5.

Of these two sets of switches SI11, SI12 and SI21, SI22, the switches SI11 and SI21 are intended for conveying the intermediate reference voltage Vcm to the input capacitors CI1 and CI2, and the other switches SI12, SI22, for conveying the input signals Vin and Vin(−) from circuits upstream to the input capacitors CI1 and CI2. In each of the integrating circuits of this embodiment, the output terminals of the local D/A converters 17a and 17b are connected to the input nodes N1 and N2. In this way, the integrator of FIG. 5 is configured as a circuit containing the adder 11 and the integrator 12 (or the adder 13 and the integrator 14) shown in FIG. 1

To add, the local D/A converters 17a and 17b are circuits to output a positive voltage and a negative voltage whose absolute values are the same as center potentials (0 V) of the reference voltage Vcm applied to their respective analog ground terminal. Where the integrators 12 and 14 are differential type circuits as shown in FIG. 5, there is provided, separately from the local D/A converter (17a) shown in FIG. 4, the local D/A converter (17b) which has the same configuration as and operates in a reverse phase to FIG. 4.

The capacitors CI1 and CI2 of the integrators 12 and 14 are so set as to optimize their ratios to the capacitors C91 through C98 of the local D/A converter, and their capacitance ratios are determined by the transfer function of the ΣΔ A/D conversion circuit. The absolute value of any capacitance is determined according to the noise level and the accuracy of machining in forming the capacitor into a semiconductor chip. The transfer function of the ΣΔ A/D conversion circuit is determined by simulation, with the required S/N ratio and the stability of the ΣΔ A/D conversion circuit being taken into account.

Figure 6:
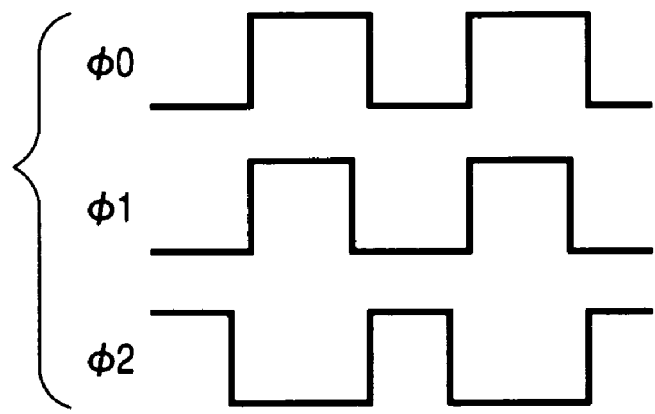
FIG. 6 is a timing chart showing the timings of operational clocks $\phi 1$ and $\phi 2$ for switching on and off switches in the integrating circuits.

FIG. 6 shows the timings of operational clocks φ1 and φ2, differing from each other in phase, for switching on and off switches in the integrator of FIG. 5. The operational clocks φ1 and φ2 are so formed as not to let their high-level periods overlap each other on the basis of a reference clock φ0 to prevent any through current from flowing.

In the integrators 12 and 14 illustrated in FIG. 5, after the switches SG1, SG2, SI12 and SI22 are turned on by the operational clock φ1 in the first phase and charges matching input signals Vin and Vin(−) are accumulated in the input capacitors CI1 and CI2, in the second phase the switches SG1, SG2, SI12 and SI22 are turned off by the operational clock φ2 and instead the switches SI1, SI2, SI11 and SI21 are turned on, and charges matching the differential voltages between the inputs Vin and Vin(−) and the reference voltage Vcm remain in CI1 and CI2. Further, at the same time, voltages resulting from the application of output voltages from the local D/A converters 17a and 17b to the nodes N1 and N2 and their addition are supplied to the differential input terminal of the differential amplifier AMP via the switches SI1 and SI2, and redistribution of charges between the input capacitors CI1 and CI2 and the integrating capacitors CM1 and CM2 causes voltages resulting from the integration of input voltages to be outputted.

Where the local A/D converter 15 and the local D/A converters 17 and 18 perform switching operations to turn on internal switches and to cause the reference voltages Vref(+), Vcm and Vref(−) from the reference voltage generators 21a through 21c to be supplied as described above, if the output impedances of the reference voltage generators 21a through 21c or the impedance of the wiring for supplying constant voltages from the reference voltage generator 21a through 21c to the local A/D converter 15 and the local D/A converters 17 are 18 are great, the reference voltages Vref(+),Vcm and Vref(−) may vary when the switches are turned on. However, since the stabilization capacitor Ca0 is connected to the reference voltage generators 21a and 21c and the stabilization capacitor Cb0 is connected to the reference voltage generator 22b in this embodiment as shown in FIG. 1, the impedances can be lowered, thereby to restrain variations of the reference voltages Vref(+), Vcm and Vref(−) during the switching operations.

Figure 7:
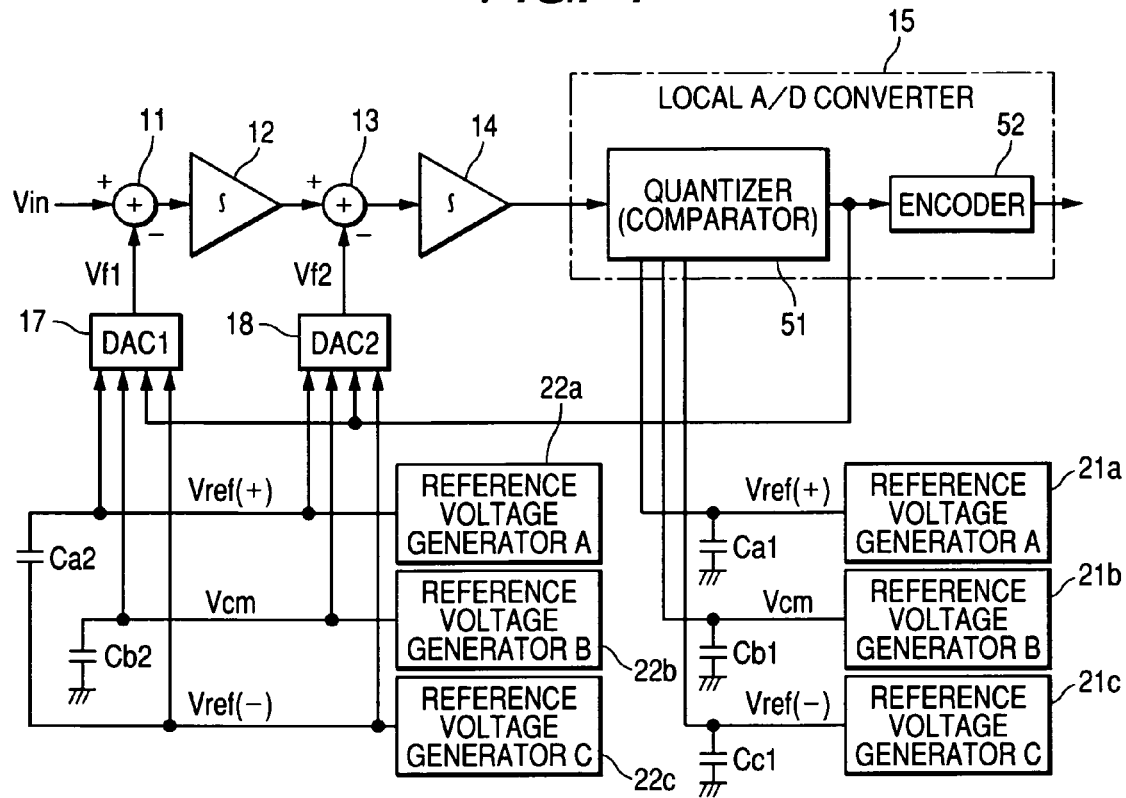
FIG. 7 is a functional block diagram of an A/D conversion circuit of a $\Sigma\Delta$ modulation system, which is a second embodiment of the invention.

FIG. 7 shows an A/D conversion circuit, which is a second embodiment of the invention. This embodiment, too, is an A/D conversion circuit of a second-order $\Sigma\Delta$ modulation system like the A/D conversion circuit shown in FIG. 1.

In this embodiment, reference voltage generators 21a, 21b and 21c for generating reference voltages Vref(+), Vcm and Vref(−) required by the local A/D converter 15 and reference voltage generators 22a, 22b, 22c for generating reference voltages Vref(+), Vcm and Vref(−) required by the local D/A converters 17 and 18 are provided as separate circuits. Along with this, reference voltage generators for generating reference voltages Vref(+), Vcm and Vref(−) required by the local D/A converters 17 and 18 are provided as reference voltage generators 22a, 22b and 22c to be used in common by the local D/A converters 17 and 18.

Further in this embodiment, stabilization capacitors Ca1, Cb1 and Cc1 of relatively small capacitances are provided between the output terminals and the grounding points of the reference voltage generators 21a, 21b and 21c, respectively. A stabilization capacitor Ca2 of a relatively large capacitance is provided between the output terminals of the reference voltage generators 22a and 22c, and a stabilization capacitor Cb2 of a smaller capacitance than that of Ca2 is provided between the output terminal and the grounding point of the reference voltage generator 22b. Incidentally, the capacitances of the stabilization capacitors Ca2 and Cb2 can be smaller than those of the stabilization capacitors Ca0 and Cb0 of the first embodiment.

In the $\Sigma\Delta$ A/D conversion circuit, if the output requires an accuracy of 14 bits, while the local D/A converter will require an accuracy of 14 bits, an accuracy of 3 bits will be sufficient for the local A/D converter 15 if its output is 3 bits. Therefore, far less accurate reference voltages suffice for the local A/D converter 15 than the reference voltages used for the local D/A converter 17.

For this reason, in this embodiment, the capacitances of the stabilization capacitors Ca1, Cb1 and Cc1 to be connected to the reference voltage generator 21a, 21b and 21c are in the order of tens of pF while the capacitance of the stabilization capacitor Ca2 to be connected between the output terminals of the reference voltage generators 22a and 22c are in the order of hundreds of pF. The capacitance of the stabilization capacitor Cb2 to be connected to the output terminal of the reference voltage generator 22b may be the same or slightly greater than those of the stabilization capacitors Ca1, Cb1 and Cc1.

To add, in the second-order $\Sigma\Delta$ A/D conversion circuit, while the former stage local D/A converter 17 requires a high accuracy comparable to that of the output, the latter stage local D/A converter 18 does not need so high an accuracy, the configuration may as well be such that the same reference voltage generators are commonly used as the reference voltage generators for generating the reference voltages to be used by the local D/A converter 18 and those for generating the reference voltage to be used by the local A/D converter 15.

Regarding the reference voltage generators 21a, 21b and 21c for generating the reference voltages Vref(+), Vcm and Vref(−) required by the local A/D converter 15, though separate stabilization capacitors Ca1, Cb1 and Cc1 are connected to them in the embodiment shown in FIG. 7, it is also possible to use a configuration in which, similarly to the reference voltage generators 22a and 22c for generating the reference voltages Vref(+) and Vref(−) required by the local D/A converter 17 and 18, stabilization capacitors are connected between the output terminals of the reference voltage generators 21a and 21c and thereby to reduce the number of capacitors. Especially where the local A/D converter 15 is composed of a differential circuit as shown in FIG. 3, this does not adversely affect the accuracy of conversion.

Figure 8:
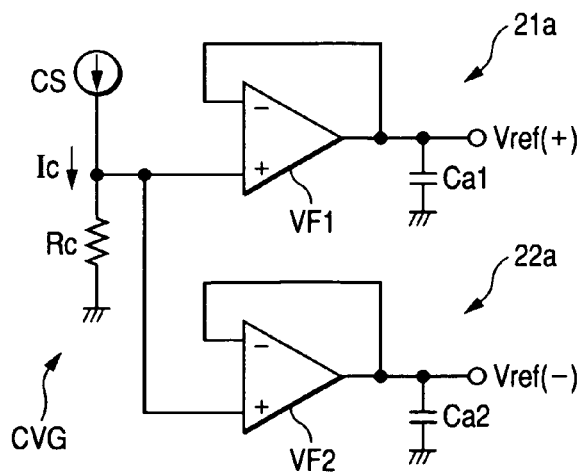
FIG. 8 is a circuit configuration diagram of a specific example of reference voltage generator in the $\Sigma\Delta$ A/D conversion circuit, which is the second embodiment of the invention.

FIG. 8 shows a specific example of circuit for the reference voltage generators 21a and 22a.

The reference voltage generators 21a or 22a is composed of a constant voltage circuit CVG comprising a constant current source CS and a resistor Rc for converting a current Ic from the constant current source CS into a voltage and voltage followers VF1 and VF2 for subjecting the generated constant voltage to impedance conversion as shown in FIG. 8. This common use of the constant voltage circuit CVG and the resultant division of the reference voltage generators into two groups can contribute to restraining the expansion of the circuit size. This is also true of the reference voltage generators 21b, 22b and 21c, 22c. The constant current source CS can be composed of a band gap reference circuit for generating a reference voltage dependent neither on the source voltage nor on the temperature and a bipolar transistor or a MOS FET (Metal Oxide Semiconductor Field Effect transistor) whose base or gate receives the generated reference voltage.

Figure 9:
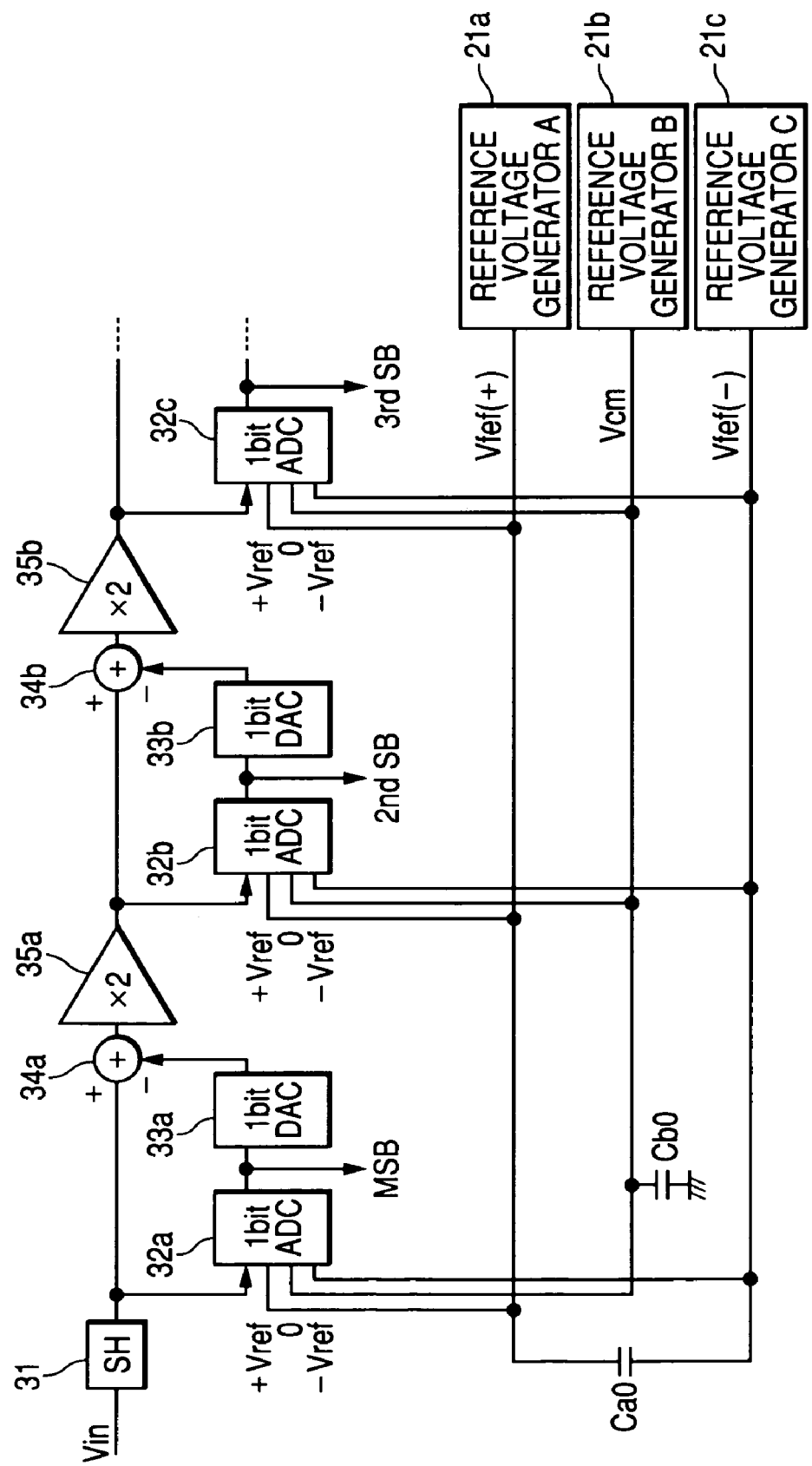
FIG. 9 is a functional block diagram of A/D conversion circuit, which is a third preferred embodiment of the invention.

FIG. 9 shows an A/D conversion circuit, which is a third preferred embodiment of the invention. The A/D conversion circuit of this embodiment is a pipeline type A/D conversion circuit.

An input signal Vin sampled by a sampling/holding circuit 31 is converted by a one-bit local A/D converter 32a of the first stage into a digital signal and outputted as the signal of the most significant bit (MSB). At the same time, the output of the local A/D converter 32a is reconverted into an analog signal by a local D/A converter 33a, its difference from the input signal Vin is calculated by an adder 34, and this difference is converted at the second stage.

At the second stage, the difference between the input signal Vin outputted from the adder 34 and the output of the D/A converter 33a is amplified by an amplifier 35a, and the amplified difference is converted into a digital signal by a one-bit local A/D converter 32b to be outputted as a second-bit signal. The output of the local A/D converter 32b is reconverted into an analog signal by a local D/A converter 33b, its difference from the output of the amplifier 35a is calculated by the adder 34, and this difference is converted at the second stage.

At the third stage, the difference calculated by the adder 34 between the output of the amplifier 35a and that of the local D/A converter 33b is amplified, and the amplified difference is converted into a digital signal by the one-bit local A/D converter 32b to be outputted as a third-bit signal. By repeating the operations described above, an A/D conversion output having a resolution matching the number of stages is obtained.

In this embodiment, the reference voltage generators for generating the reference voltages Vref(+), Vcm and Vref(−) required by the local A/D converters 32a through 32c are provided as common reference voltage generators 21a, 21b and 21c for shared use by the local A/D converters 32a through 32c. Along with this, a stabilization capacitor Ca0 of a relatively large capacitance is connected between the reference voltage generators 21a and 21c, and a stabilization capacitor Cb0 of a smaller capacitance than Ca2 is connected between the output terminal and the grounding point of the reference voltage generator 21b. Similar effects to those of the A/D conversion circuit of the first embodiment can be thereby obtained.

As any quantization error occurring in the local A/D converters is amplified as the process advances to later stages in the A/D conversion circuit of this embodiment, the local A/D converter of an earlier stage requires higher accuracy than that of any later stage. Therefore, in this embodiment as well, the reference voltage generators for generating the reference voltages Vref(+), Vcm (0 V) and Vref(−) needed by the local A/D converter 32a of the initial stage and the reference voltage generators for generating the reference voltages Vref (+), Vcm and Vref(−) needed by the local A/D converters 32b, 32c . . . of the second and subsequent stages may be provided as separate circuits.

As in the embodiment illustrated in FIG. 7, common reference voltage generators may be used for generating the reference voltages Vref(+), Vcm and Vref(−) needed by the local A/D converter 32a of the initial stage and for generating the reference voltages Vref(+), Vcm and Vref(−) needed by the local A/D converter 32b of the second stage, with reference voltage generators for generating the reference voltages Vref(+), Vcm and Vref(−) needed by the local A/D converter 32c of the third and later stages being provided as separate circuits.

Next, an example of configuration of an RF-IC and wireless communication system which uses the ΣΔ A/D conversion circuit of the above-described embodiment as the A/D conversion circuit, built into the RF-IC, for converting I and Q signals demodulated by a demodulator into digital signals will be described with reference to FIG. 10.

Figure 10:
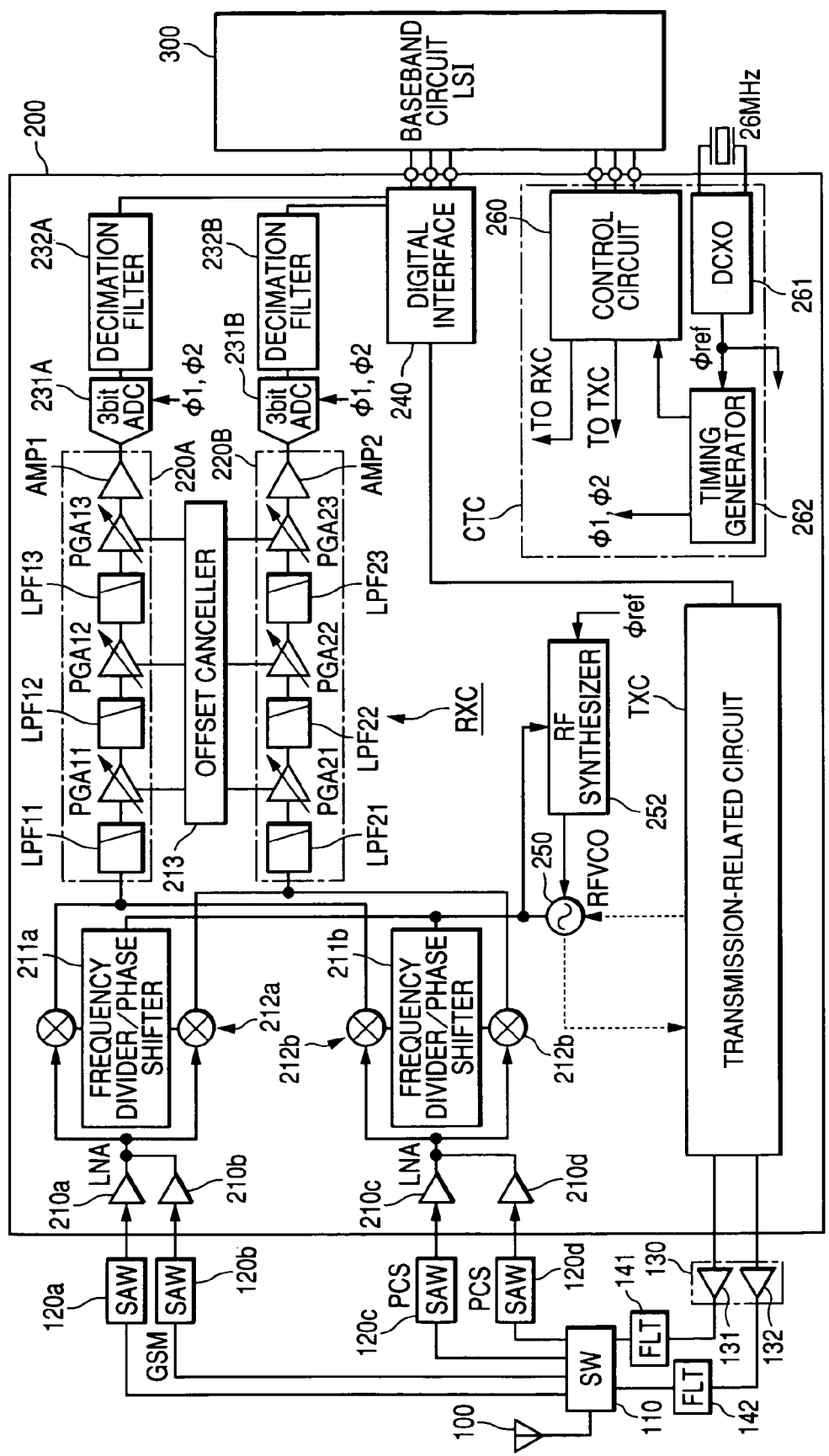
FIG. 10 is a block diagram showing an example of configuration of an RF-IC and wireless communication system in which the A/D conversion circuit embodying the invention is used as the A/D conversion circuit built into the RF-IC for conversion of demodulated I and Q signals into digital signals.

As shown in FIG. 10, the wireless communication system of this embodiment comprises an antenna 100 for transmitting and receiving signal waves, a switch 110 for switching between transmission and reception, high-frequency filters 120a through 120d, consisting of SAW filters or the like, for clearing receive signals of any unnecessary wave, a high-frequency power amplifier (power module) 130 for amplifying transmit signals, a high-frequency IC 200 for demodulating receive signals or modulating transmit signals, and a baseband circuit 300 for converting into I and Q signals and controlling the high-frequency IC 200. The high-frequency IC 200 and the baseband circuit 300 are configured as semiconductor integrated circuits on separate semiconductor chips.

The high-frequency IC 200 in this embodiment is configured to be capable of modulating and demodulating signals in four frequency bands of communication systems including but not limited to GSM850, GSM900, DCS1800 and PCS1900. To match these frequency bands, its high-frequency filters include a filter 120a passing receive signals of the GSM850 frequency band, a filter 120b passing receive signals of the GSM900 frequency band, filter 120c passing receive signals of the DCS1800 frequency band and a filter 120d passing receive signals of the PCS1900 frequency band.

The high-frequency IC 200 in this embodiment comprises in broad terms a reception-related circuit RXC, a transmission-related circuit TXC and a control-related circuit CTC including other circuits for common transmission/reception purposes, such as a control circuit and a clock generator.

The reception-related circuit RXC comprises low-noise amplifiers 210a, 210b, 210c and 210d for amplifying the receive signals of the GSM850, GSM900, DCS1800 and PCS1900 frequency bands, a high-frequency oscillator (RFVCO) 251 for generating a local oscillation signal (RF, an RF synthesizer 252 consisting of frequency dividers, phase comparators, charge pumps, loop filters and so forth and constituting an RF-PLL circuit together with the high-frequency oscillator (RFVCO) 251, frequency divider/phase shifters 211a and 211b for generating orthogonal signals lagging in phase by 90 (by dividing the frequency of the local oscillation signal (RF generated by the RF-PLL circuit, a mixer 212a for mixing the orthogonal signals generated by the frequency divider/phase shifter 211 with the GSM receive signals amplified by the low-noise amplifiers 210a and 210b and thereby demodulating and down-converting them, and another mixer 212b for mixing the orthogonal signals generated by the frequency divider/phase shifter 211b with the DCS and PCS receive signals amplified by the low-noise amplifiers 210c and 210d and thereby demodulating and down-converting them.

The reception-related circuit RXC further has high-gain amplifying units 220A and 220B, common for all the frequency bands, for amplifying the I and Q signals demodulated by the mixers 212a and 212b and supplying the amplified signals to the baseband circuit 300; an offset canceller 213 for canceling the input DC offsets of the amplifiers in the high-gain amplifying units 220A and 220B; A/D converter 231A and 231B, having a similar configuration to their counterparts in the foregoing embodiment, for converting the I and Q signals amplified by the high-gain amplifying units 220A and 220B into three-bit digital signals for instance; and decimation filters 232A and 232B for converting the three-bit digital signals resulting from the foregoing conversion and having a high resolution in the direction of the time axis into 14-bit signals having a high resolution in the voltage direction. By converting the three-bit signals into the 14-bit low-frequency signals, the speed of data transfer from the high-frequency IC 200 to the baseband circuit 300 can be slowed down.

The high-gain amplifying unit 220A has a configuration in which a plurality each of low-pass filters LPF11, LPF12, LPF13 and LPF14 and gain control amplifiers PGA11, PGA12 and PGA13 are alternately connected in series, and an amplifier AMP1 is connected at the final stage. This amplifying unit amplifies the demodulated I signals to a prescribed amplitude level while removing unnecessary waves. Similarly in the high-gain amplifying unit 220B, a plurality each of low-pass filters LPF21, LPF22, LPF23 and LPF24 and gain control amplifiers PGA21, PGA22 and PGA23 are alternately connected in series, and an amplifier AMP2 is connected at the final stage. This amplifying unit amplifies the demodulated Q signals to a prescribed amplitude level.

The offset canceller 213 comprises an A/D converter (ADC) for converting, in a state in which input terminals disposed to respectively match the gain control amplifiers PGA11 through PGA23 are short-circuited to one another, differences among their potentials into digital signals, a D/A converter (DAC) for generating, on the basis of the result of conversion by this A/D converter, input offset voltages which would reduce the DC offsets of the outputs of the matching gain control amplifiers PGA11 through PGA23 to "0" and giving them to differential inputs, and a control circuit to cause canceling operations to be performed by controlling these A/D converter (ADC) and D/A converter (DAC) The 14-bit digital I and Q signals resulting from conversion by the decimation filters 232A and 232B are supplied to the baseband LSI 300 via a digital interface circuit 240.

The transmission-related circuit TXC comprises, though not shown, a modulator for modulating the I signals and Q signals supplied from the baseband circuit 300 and a frequency converter for up-converting the modulated signals into signals of the transmit frequency. The up-converted transmit signals are power-amplified by the power module 130 and, after being cleared of unnecessary waves by filters 141 and 142, are supplied to the antenna 100 via the change-over switch 110. The power module 130 is provided with a power amplifier 131 for amplifying GSM transmit signals and a power amplifier 132 for amplifying DCS and PCS transmit signals, though its possible configuration is not limited to this. Since transmission and reception are differentiated in time according to the GSM system, it is also possible to configure the RFVCO 251 as a common oscillator for the reception-related circuit RXC and the transmission-related circuit TXC.

On the chip of the high-frequency IC 200 of this embodiment, there are provided a control circuit 260 for controlling the whole chip, a reference oscillator (VCXO) 261 for generating a reference oscillation signal (ref and a timing generator 262 for generating the clock signals (1 and (2 which give operational timings to the A/D converters 231A and 231B on the basis of the reference oscillation signal (ref and a clock signal which is generated by the control circuit 260 and serves as the reference for control signals within the chip.

Incidentally, as the reference oscillation signal $\phi$ref requires a high level of frequency accuracy, an external quartz oscillator is connected to the reference oscillator 261. For the reference oscillation signal $\phi$ref, a frequency of 26 MHz (or 13 MHz) is selected for instance, because a quartz oscillator of such a frequency is a general-purpose component and is readily available. In the RF-IC of this embodiment, the frequency of the clock signals $\phi1$ and $\phi2$, which give operational timings to the A/D converters 231A and 231B, is also supposed to be 26 MHz. On the other hand, the signals inputted to the A/D converters 231A and 231B to be converted are supposed to have a frequency of hundreds of kHz. This makes possible A/D conversion by over-sampling.

To the control circuit 260, a clock signal CLK for synchronizing use from the baseband LSI 300, data signals SDATA and a load enable signal LEN as a control signal are supplied, and the control circuit 260, when the load enable signal LEN is asserted to a valid level, the data signals SDATA transmitted from the baseband circuit 300 are successively captured in synchronism with the clock signal CLK to generate control signals within the chip. The data signals SDATA are transmitted serially, though this is not an absolute requirement. The baseband LSI 300 is composed of a microprocessor or the like.

In the high-frequency IC 200 of this embodiment, since the A/D converters 231A and 231B are provided at the final stage of the reception-related circuit to digitize the I and Q signals, no loss is incurred in signal transmission to the baseband circuit 300, resulting in an improved S/N ratio. Also a configuration in which digital filtering and other relevant processing are carried out on the part of the baseband circuit 300 which receives the digital I and Q signals enables the high-gain amplifying units 220A and 220B to receive highly accurate data without having to amplify the receive signals with a significantly high gain to remove noise. Accordingly, it is made possible to simplify the multi-stage connected gain control amplifiers and filters in the high-gain amplifying units 220A and 220B, and thereby to reduce the chip size.

Although the invention achieved by the present inventors has been hither to described with reference to some preferred embodiments thereof, obviously the invention is not limited to these embodiments, but can be modified in various ways without deviating from the true spirit and scope thereof. For instance in the second embodiment, though a stabilization capacitor is connected to each of the reference voltage generators for the local A/D converters and of those for the local D/A converters, one for the local A/D converters stabilization capacitors can be dispensed with by, for instance, composing the voltage followers of large-size transistors and using reference voltage generators of low output impedance. However, as such a configuration would result in an increase in the area occupied by the reference voltage generators, choice can be made between this possibility and the increase in the area resulting from the installation of the stabilization capacitors.

Further in the above-described embodiment, separate voltage followers VF1 and VF2 are provided for the reference voltages Vref(+) and Vref(−), but an available alternative is a configuration in which reference voltages Vref(+) and Vref(−) are supplied from a single differential output type amplifier in which an inverted output terminal and a non-inverted output terminal are provided and a resistor is connected between the inverted output terminal and the non-inverted output terminal.

Further, while the embodiment described above is supposed to be an application of the invention to a second-order $\Sigma\Delta$ A/D conversion circuit, the invention can as well be applied to first-order $\Sigma\Delta$ A/D conversion circuits and third- or higher order $\Sigma\Delta$ A/D conversion circuits. Though the local A/D converters and local D/A converters in the embodiment are supposed to be composed of switched capacitor type circuits, the invention can also be applied where non-switched capacitor type local A/D converters and local D/A converters are used.

Although the foregoing description mainly concerned the application of the invention achieved by the present inventors to high-frequency ICs used in wireless communication systems, such as cellular phones, which constitute the area of utilization underlying the invention, the invention is not limited to such applications, but can also be applied to semiconductor integrated circuits with built-in $\Sigma\Delta$ A/D conversion circuits for non-communication use.

What is claimed is:

1. A semiconductor integrated circuit having a built-in $\Sigma\Delta$ A/D conversion circuit including two integrators each having a differential amplifier, a local A/D converter and two local D/A converters, said semiconductor integrated circuit further comprising:
    a common first reference voltage generator for generating a first reference voltage which is supplied to two local D/A converters; and
    a common second reference voltage generator for generating a second reference voltage which is supplied to said two local D/A converters,
    wherein a capacitance element for stabilizing the generated reference voltages is coupled between the output terminal of said first reference voltage generator and that of said second reference voltage generator, and a reference voltage generator for generating a first reference voltage and another reference voltage generator for generating a second reference voltage which is supplied to said local A/D converter are provided as separate circuits from said first and second reference voltage generators.

2. A semiconductor integrated circuit having a built-in A/D conversion circuit including a differential amplifier, a local A/D converter, and a local D/A converter, said semiconductor integrated circuit comprising:
    a common first reference voltage generator for generating a first reference voltage which is supplied to said local A/D converter and said local D/A converter;
    a common second reference voltage generator for generating a second reference voltage which is supplied to said local A/D converter and said local D/A converter, wherein a capacitance element for stabilizing the generated reference voltages is coupled between the output terminal of said first reference voltage generator and that of said second reference voltage generator; and a third reference voltage generator for generating a third reference voltage which is intermediate between said first reference voltage and second reference voltage, wherein a second capacitance element for stabilizing the generated reference voltages is coupled between the output terminal of the third reference voltage generator and a source voltage terminal.

3. The semiconductor integrated circuit according to claim 2, wherein the capacitance of said capacitance element coupled between the output terminal of said first reference voltage generator and that of said second reference voltage generator is greater than the capacitance of the second capacitance element coupled to the output terminal of said third reference voltage generator.

4. The semiconductor integrated circuit according to claim 3, wherein said capacitance element coupled between the output terminal of said first reference voltage generator and that of said second reference voltage and the second capacitance element coupled to the output terminal of said third reference voltage generator are elements formed on the same semiconductor chip on which the element constituting said A/D converter is formed.

5. A semiconductor integrated circuit having a built-in A/D conversion circuit including a differential amplifier, a local A/D converter, and a local D/A converter, said semiconductor integrated circuit comprising:

a common first reference voltage generator for generating a first reference voltage which is supplied to said local A/D converter and said local D/A converter; and a common second reference voltage generator for generating a second reference voltage which is supplied to said local A/D converter and said local D/A converter, wherein a capacitance element for stabilizing the generated reference voltages is coupled between the output terminal of said first reference voltage generator and that of said second reference voltage generator, wherein each of said first reference voltage generator and second reference voltage generator comprises a constant voltage circuit and an impedance converter, and said constant voltage circuit is provided as a common circuit for the impedance converters.

6. The semiconductor integrated circuit according to claim 5, wherein said capacitance element coupled between the output terminal of said first reference voltage generator and that of said second reference voltage generator is arranged in a position close to the area in which the first stage side local D/A converter out of said two local D/A converters is disposed on said semiconductor chip.

7. A semiconductor integrated circuit for communication use having a demodulator for synthesizing receive signals and oscillation signals of a prescribed frequency to generate demodulated signals containing a frequency component corresponding to the difference between the frequency of the oscillation signals and that of said receive signals and a built-in A/D conversion circuit, wherein the A/D conversion circuit includes a differential amplifier, a local A/D converter, and a local D/A converter, said semiconductor integrated circuit comprising:

a common first reference voltage generator for generating a first reference voltage which is supplied to said local A/D converter and said local D/A converter;

a common second reference voltage generator for generating a second reference voltage which is supplied to said local A/D converter and said local D/A converter, wherein a capacitance element for stabilizing the generated reference voltages is coupled between the output terminal of said first reference voltage generator and that of said second reference voltage generator, wherein the A/D conversion circuit is used as the circuit for converting the analog demodulated signals generated by said demodulator into digital signals;

a PLL circuit including a voltage-controlled oscillator for generating the oscillation signals of said prescribed frequency to be synthesized with said receive signals; and a reference oscillator for generating a oscillation signal to serve as a reference, wherein the PLL circuit compares the oscillation output of said voltage-controlled oscillator with the reference oscillation signal generated by said reference oscillator and controls the oscillation frequency of said voltage-controlled oscillator, and operational clock signals for said A/D conversion circuit are generated on the basis of said reference oscillation signal.

8. A semiconductor integrated circuit having a built-in A/D conversion circuit of a pipeline processing system, including a plurality of differential amplifiers, a plurality of local A/D converters and a plurality of local D/A converters, said semiconductor integrated circuit comprising:

a common first reference voltage generator for generating a first reference voltage;

a common second reference voltage generator for generating a second reference voltage both for use by said plurality of local A/D converters, wherein a capacitance element for stabilizing the generated reference voltages is coupled between the output terminal of said first reference voltage generator and that of said second reference voltage generator; and a third reference voltage generator for generating a third reference voltage which is intermediate between said first reference voltage and second reference voltage, wherein a second capacitance element for stabilizing the generated reference voltages is coupled between the output terminal of the third reference voltage generator and a source voltage terminal.

* * * * *